(12) United States Patent
Dudek

(10) Patent No.: US 10,847,626 B2
(45) Date of Patent: Nov. 24, 2020

(54) STACKED III-V SEMICONDUCTOR COMPONENT

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

(*) Notice: Subject to any disclaimer, the term of this patent is extended or adjusted under 35 U.S.C. 154(b) by 119 days.

(21) Appl. No.: 16/229,990

(22) Filed: Dec. 21, 2018

(65) Prior Publication Data

US 2019/0198625 A1 Jun. 27, 2019

(30) Foreign Application Priority Data

Dec. 21, 2017 (DE) .......................... 10 2017 011 878

(51) Int. Cl.
*H01L 29/47* (2006.01)
*H01L 29/207* (2006.01)
(Continued)

(52) U.S. Cl.
CPC ...... *H01L 29/207* (2013.01); *H01L 21/02546* (2013.01); *H01L 21/304* (2013.01);
(Continued)

(58) Field of Classification Search
CPC ............. H01L 21/02546; H01L 21/304; H01L 29/0619; H01L 29/0692; H01L 29/20;
(Continued)

(56) References Cited

U.S. PATENT DOCUMENTS 3,958,265 A * 5/1976 Charmakadze ..... H01L 33/0025
257/96
4,001,055 A * 1/1977 Charmakadze ..... H01L 33/0025
117/56
(Continued)

FOREIGN PATENT DOCUMENTS

DE 10 2015 100 340 A1 8/2015
DE 102015115723 A1 3/2016
(Continued)

OTHER PUBLICATIONS

Viktor Voitovich et al, "LPE technology for power GaAs diode structures", Estonian Journal of Engineering, 2010, 16, 1, 11-22, pp. 11-22 XP055498749.
(Continued)

*Primary Examiner* — Brook Kebede
(74) *Attorney, Agent, or Firm* — Muncy, Geissler, Olds & Lowe, P.C.

(57) ABSTRACT

A stacked III-V semiconductor component having a $p^+$ region with a top side, a bottom side, and a dopant concentration of $5 \cdot 10^{18}$-$5 \cdot 10^{20}$ N/cm$^3$, a first $n^-$ layer with a top side and a bottom side, a dopant concentration of $10^{12}$-$10^{17}$ N/cm$^3$, and a layer thickness of 10-300 µm, an $n^+$ region with a top side, a bottom side, and a dopant concentration of at least $10^{18}$ N/cm$^3$, wherein the $p^+$ regions, the $n^-$ layer, and the $n^+$ region follow one another in the stated order, are each formed monolithically, and each comprise a GaAs compound or consist of a GaAs compound, the $n^+$ region or the $p^+$ region is formed as the substrate layer, and the $n^-$ layer comprises chromium with a concentration of at least $10^{14}$ N/cm$^3$ or at least $10^{15}$ N/cm$^3$.

15 Claims, 2 Drawing Sheets

(51) Int. Cl.

| | | |
|---|---|---|
| *H01L 29/06* | (2006.01) | |
| *H01L 29/20* | (2006.01) | |
| *H01L 29/739* | (2006.01) | |
| *H01L 29/66* | (2006.01) | |
| *H01L 21/02* | (2006.01) | |
| *H01L 21/304* | (2006.01) | |
| *H01L 29/32* | (2006.01) | |
| *H01L 29/36* | (2006.01) | |
| *H01L 29/861* | (2006.01) | |
| *H01L 29/872* | (2006.01) | |
| *H01L 29/205* | (2006.01) | |
| *H01L 21/306* | (2006.01) | |

(52) U.S. Cl.
CPC ...... *H01L 29/0619* (2013.01); *H01L 29/0692* (2013.01); *H01L 29/20* (2013.01); *H01L 29/32* (2013.01); *H01L 29/36* (2013.01); *H01L 29/66204* (2013.01); *H01L 29/66212* (2013.01); *H01L 29/66333* (2013.01); *H01L 29/66348* (2013.01); *H01L 29/7395* (2013.01); *H01L 29/7397* (2013.01); *H01L 29/861* (2013.01); *H01L 29/872* (2013.01); *H01L 21/30625* (2013.01); *H01L 29/205* (2013.01)

(58) Field of Classification Search
CPC ....... H01L 29/207; H01L 29/32; H01L 29/36; H01L 29/66204; H01L 29/66212; H01L 29/66333; H01L 29/66348; H01L 29/7395; H01L 29/7397; H01L 29/861; H01L 29/872
USPC .................. 438/570, 580, 581; 257/472, 484
See application file for complete search history.

(56) References Cited

U.S. PATENT DOCUMENTS

| | | | |
|---|---|---|---|
| 5,459,655 | A | 10/1995 | Mori et al. |
| 5,733,815 | A | 3/1998 | Ashkinazi et al. |
| 5,811,873 | A | 9/1998 | Soejima |
| 8,525,302 | B2 | 9/2013 | Matthias |
| 9,324,783 | B2 | 4/2016 | Falck et al. |
| 9,443,971 | B2 | 9/2016 | Haertl et al. |
| 9,484,221 | B2 | 11/2016 | Schmidt et al. |
| 9,685,504 | B2 | 6/2017 | Haertl et al. |
| 10,276,730 | B2 | 4/2019 | Dudek |
| 10,340,394 | B2 | 7/2019 | Dudek |
| 2002/0163059 | A1* | 11/2002 | Hamerski ........... H01L 21/0262 257/592 |
| 2006/0281263 | A1 | 12/2006 | Yamazaki et al. |
| 2016/0351392 | A1 | 12/2016 | Iwami et al. |
| 2018/0277687 | A1 | 9/2018 | Dudek |

FOREIGN PATENT DOCUMENTS

| | | | |
|---|---|---|---|
| DE | 10 2014 223 315 A1 | 5/2016 | |
| DE | 102017002935 A1 | 9/2018 | |
| EP | 0749166 A1 | 12/1996 | |
| EP | 2 535 940 A1 | 12/2012 | |
| EP | 2013-004982 A | 1/2013 | |
| EP | 3321972 A1 | 5/2018 | |
| EP | 3379581 A1 | 9/2018 | |
| JP | H 08-501656 A | 2/1996 | |
| JP | 2001-077357 A | 3/2001 | |
| JP | 2007-251003 A | 9/2007 | |
| JP | 2010-177361 A | 8/2010 | |
| WO | WO0074130 A1 | 12/2000 | |
| WO | WO 2015/137373 A1 | 9/2015 | |

OTHER PUBLICATIONS

Tom Simon et al, "Gallium arsenide semiconductor parameters extracted from pin diode measurements and simulations", IET Power Electronics, Mar. 30, 2016, pp. 689-697, XP055498441.

G. Ashkinazi et al, Process and Device Characterization of High Voltage Gallium Arsenide P-i-N Layers grown by an improved liquid phase epitaxy method, Jan. 1, 1993, pp. 1749-1755, XP055498521.

A.Koel, "Characterization of the temperature dependent behavior of snappy phenomenon by the switching-off of GaAs power diode structures", Advances in Fluid Mechanics XI, Jul. 1, 2014, pp. 439-449 Xp055545469.

Josef Lutz et al, Semiconductor Power Devices, Springer Verlag, 2011.

"GaAs Power Devices", Chapter 3, pp. 22-27 by German Ashkinazi, 1999.

* cited by examiner

STACKED III-V SEMICONDUCTOR COMPONENT

This nonprovisional application claims priority under 35 U.S.C. § 119(a) to German Patent Application No. 10 2017 011 878.7, which was filed in Germany on Dec. 21, 2017, and which is herein incorporated by reference.

BACKGROUND OF THE INVENTION

Field of the Invention

The present invention relates to a stacked III-V semiconductor component.

Description of the Background Art

High-blocking Schottky diodes and IGBTs based on silicon or SiC are known from Josef Lutz et al., Semiconductor Power Devices, Springer Verlag, 2011, ISBN 978-3-642-11124-2.

High-voltage-resistant $p^+$-n-$n^+$ semiconductor diodes as well as Schottky diodes and high-voltage-resistant p-n-i-p transistors based on GaAs are known from "GaAs Power Devices" by German Ashkinazi, ISBN 965-7094-19-4.

SUMMARY OF THE INVENTION

It is an object of the present invention to provide a device that refines the prior art.

In an exemplary embodiment of the invention a stacked III-V semiconductor component is provided having a $p^+$ region with a top side, a bottom side, and an electrically active dopant concentration of $5 \cdot 10^{18}$-$5 \cdot 10^{20}$ N/cm³.

The stacked III-V semiconductor component has an $n^-$ layer with a top side and a bottom side and a dopant concentration of $10^{12}$-$10^{17}$ N/cm³. The $n^-$ layer has a layer thickness between 10 μm to 300 μm.

The stacked III-V semiconductor component has an $n^+$ region with a top side, a bottom side, and an electrically active dopant concentration of at least $10^{18}$ N/cm³.

The $p^+$ region and the $n^-$ layer and the $n^+$ region follow one another in the stated order and are each formed monolithically and each comprise a GaAs compound or each consist of a GaAs compound.

The $n^+$ region or $p^+$ region is formed as a substrate layer. The $n^-$ layer comprises a concentration of defects of at least $10^{14}$ N/cm³ or of at least $10^{15}$ N/cm³.

The concentration of defects in the n layer can be less than $10^{17}$ N/cm³, most preferably less than $5 \times 10^{16}$ N/cm³.

Preferably, most layers or all of the aforementioned semiconductor layers can be produced by liquid-phase epitaxy (LPE) or by an MOVPE system.

In contrast to the previous belief that GaAs is only suitable for fast components or solar cells with blocking voltages in the low voltage range, i.e., below 10 volts, it has surprisingly been found that thick $n^-$ layers, i.e., layers greater than 30 μm or preferably greater than 60 μm, with good crystal quality can be easily and inexpensively deposited by means of the aforementioned epitaxy systems.

This surprisingly makes it possible to produce high-blocking semiconductor components made of GaAs. In the present case, semiconductor components with a blocking voltage above 100 V are referred to as high-blocking components.

The semiconductor component can have at least two connection contacts preferably formed as layers, wherein the connection contacts are each electrically conductive and have metallic properties.

The connection contacts can be formed of metallically conductive semiconductor layers or metal layers or a combination of both. The connection contacts produce an electrically low-resistance contact with the directly adjacent doped semiconductor layers.

Furthermore, the connection contacts can be connected to contact fingers, the so-called pins, by means of bond wires or solder joints. The connection contacts are preferably disposed on a top side or a bottom side of the stack formed from the semiconductor regions or semiconductor layers.

Surprisingly, it was found that, contrary to the previous efforts to prevent defects due to the formation of recombination centers in all cases in epitaxy, in order to achieve the best possible crystal quality, leakage currents can be reduced by a targeted incorporation of recombination centers into the $n^-$ layer.

By incorporating recombination centers, the diffusion length of the charge carriers can be substantially reduced, so that the charge carriers reach the space charge zone with a much lower probability and are separated according to their polarity.

Furthermore, it has surprisingly been found that during forward operation of the component (i.e., the space charge region is flooded with charge carriers), the current flow is reduced only negligibly.

In other words, in the case of a reduction of the leakage current by a factor of 10 to 100 for high-blocking components such as diodes or IGBT, the leakage current is in a range between a few pA and mA, depending on the level of blocking voltage and temperature, and is insignificant in the forward operation with currents in the range above a few 100 mA to a few 10 A.

The defect layer may not be formed within the space charge region. Preferably, the thickness of the $n^-$ layer is formed such that the defect layer is spaced from the space charge region.

Furthermore, the leakage currents increase greatly with temperature up to a few 10 mA. Due to the exponential rise with increasing temperature, low leakage currents are therefore especially helpful when used in hot environments of up to 300° C. This is achieved by the defect layer of the invention. By incorporating the defect layer, the leakage currents can be reduced by more than an order of magnitude compared with semiconductor components without a defect layer.

Furthermore, the manufacturing process becomes much more robust, i.e., insensitive to high background doping.

A further advantage is that, with the III-V semiconductor components of the invention, it is possible in a simple way in particular in the case of diodes or IGBTs to produce low leakage currents at blockage voltages in a range of 200 V to 3300 V with smaller on-resistances and smaller capacitances per unit area as is the case with conventional high-blocking diodes made of Si or SiC.

Switching frequencies from 30 kHz up to 0.5 GHz and current densities of 0.5 A/mm² to 5 A/mm² can be achieved in this way. In this case, the III-V semiconductor diode of the invention can be produced more cost-effectively than comparable high-blocking diodes made of SiC.

Semiconductor diodes according to this embodiment of the invention can be preferably used as, for example, freewheeling diodes.

Thus, the III-V semiconductor diodes can have low on-resistances in a range between 1 mOhm and 200 mOhm. The capacitances per unit area are in a range between 2 pF and 100 pF and are significantly lower than comparable SiC diodes.

Another advantage is that the charge carriers in GaAs semiconductor structures have a smaller effective mass in comparison with silicon. Also, in comparison with Si, higher temperatures can be achieved at the pn junctions without the components being destroyed. As a result, higher switching frequencies and lower losses can also be achieved with the GaAs semiconductor structures with high blocking voltages than with comparable Si semiconductor structures. In addition, the III-V semiconductor components of the invention due to a high temperature resistance of up to 300° C. can also be used in hot environments, i.e., in a range up to 180° C.

A further advantage is that the III-V semiconductor diodes can be manufactured much more cost-effectively than comparable high-blocking diodes made of SiC.

The surface of the $n^+$ substrate and the surface of the $p^+$ substrate can be metallized so as to electrically connect the components, in particular the semiconductor diode.

The cathode of the semiconductor diode after the metallization can be integrally connected to a support formed as a heat sink. In other words, the anode is formed on the surface of the diode on the $p^+$ layer.

The $p^+$ region and $n^+$ region can be formed layered and the layered $n^+$ region and the layered $p^+$ region are each integrally connected to the $n^-$ layer, wherein the layered $n^+$ region has a layer thickness of 50-675 µm and the layered $p^+$ region has a layer thickness greater than 2 µm.

The $n^-$ region can comprise a defect layer with a layer thickness between 0.5 µm and 50 µm, wherein the defect layer has a defect concentration in a range between $1\cdot10^{13}$ N/cm$^3$ and $5\cdot10^{16}$ N/cm$^3$.

The defect layer can be at a distance from an interface. The term interface in the present case can refer to the junction between two different doped layers or regions, in particular to the junction between the $n^-$ layer and the interlayer or to the junction between the $n^-$ layer and the $p^+$ region or to the junction between the $n^-$ layer and the $n^+$ region. The distance can be at most half the layer thickness of the $n^-$ layer.

The defect layer can be produced in different ways, for example, by implantation or by incorporation of foreign atoms, and a recombination of charge carriers is achieved within the defect layer. Preferably, the defects or recombination centers are achieved by incorporation of chromium.

According to a further alternative embodiment, the $p^+$ region and the $n^+$ region are formed layered, wherein the layered $n^+$ region is integrally connected to the $n^-$ layer, and a doped or undoped interlayer with a layer thickness of 1-50 µm and a dopant concentration of $10^{12}$-$10^{17}$ cm$^3$ is disposed between the $n^-$ layer and the $p^+$ layer and the interlayer is integrally connected to the $n^-$ layer and to the $p^+$ layer.

It is understood that the interlayer has at least a different dopant concentration compared with the integrally bonded layers.

The interlayer can be p-doped and can comprise zinc or silicon. The dopant concentration of the p-doped interlayer is particularly preferably less than the dopant concentration of the $p^+$ region, in particular by a factor of 2 up to a factor of 5 orders of magnitude.

Alternatively, the interlayer is n-doped and can comprise silicon and/or tin, wherein the dopant concentration of the n-doped interlayer is particularly preferably less than the dopant concentration of the $n^-$ region by up to a factor of 100.

An advantage is that, with the III-V semiconductor diode formed according to this embodiment, it is possible in a simple way to produce blocking voltages in a range of 200 V to 3300 V with lower on-resistances and lower capacitances per unit area than is the case with conventional high-blocking diodes made of Si or SiC. Switching frequencies from 30 kHz up to 0.5 GHz and current densities of 0.5 A/mm$^2$ to 5 A/mm$^2$ can be achieved in this way. In particular, the III-V semiconductor diodes of the invention can be used as freewheeling diodes.

It should be noted that according to this embodiment the III-V semiconductor diodes have low on-resistances in a range between 1 mOhm and 200 mOhm. The capacitances per unit area are in a range between 2 pF and 100 pF.

It should also be noted that the defect layer may not be formed within the space charge zone. For example, the thickness of the p layer can be formed such that the defect layer is spaced from the space charge zone.

The $p^+$ region and the $n^+$ region can be formed layered, the layered $n^+$ region and the layered $p^+$ region are integrally connected to the $n^-$ layer, and the dopant concentration increases by a factor between 1.5 and 2.5 within the $n^-$ layer from the surface, adjacent to the $p^+$ region, of the $n^-$ layer to the surface, adjacent to the $n^+$ region, of the $n^-$ layer.

The dopant concentration of the $n^-$ layer 14 can change in steps; i.e., the dopant concentration has a profile parallel to the layer thickness of the $n^-$ layer 14 with at least one step or a plurality of steps as well. Alternatively, the profile has a gradient, therefore a steady increase.

The layered $p^+$ region can be formed as the substrate with a layer thickness of 50-500 µm and the layered $n^+$ region has a layer thickness less than 30 µm.

The layered $n^+$ region can be formed as the substrate with a layer thickness of 50-400 µm and the layered $p^+$ region has a layer thickness greater than 2 µm.

The $p^+$ region and the $n^+$ region can be formed layered, a p-doped interlayer with a layer thickness of 1-50 µm and a dopant concentration of $10^{12}$-$10^{17}$ N/cm$^3$ is disposed between the $n^-$ layer and the $p^+$ region, the layered $n^+$ region and the interlayer are each integrally connected to the $n^-$ layer, and the layered $p^+$ region is integrally connected to the interlayer, and the stacked III-V semiconductor component has a first defect layer with a layer thickness between 0.5 µm and 40 µm, wherein the defect layer is disposed within the p-doped interlayer and has a defect concentration in a range between $1\cdot10^{13}$ N/cm$^3$ and $5\cdot10^{16}$ N/Cm$^3$.

The previous statements can apply to the interlayer and the defect layer of this embodiment.

The stacked layer structure formed of the $p^+$ substrate, the $n^-$ layer, and the $n^+$ layer has a semiconductor bond formed between the $n^-$ layer and the $p^+$ substrate.

It is noted that the term semiconductor bond can be used synonymously with the term wafer bond.

The layer structure formed of a $p^+$ substrate forms a first substack and the layer structure formed of the $n^+$ layer and one of the $n^-$ layers forms a second substack.

The stacked layer structure comprises an interlayer disposed between the $p^+$ substrate and the $n^-$ layer. In this case, the first substack comprises the interlayer. The semiconductor bond is located between the interlayer and the $n^-$ layer.

The first substack and the second substack can each be formed monolithically.

The first substack can be formed in which the interlayer is produced starting from a $p^+$ substrate by epitaxy. For example, the interlayer formed as a p$^-$ layer has a doping less than $10^{13}$ N/cm$^{-3}$ (i.e., the interlayer is intrinsically doped), or a doping between $10^{13}$ N/cm$^{-3}$ and $10^{15}$ N/cm$^{-3}$. The p$^+$ substrate can be thinned before or after the bonding to a thickness between 200 μm and 500 μm by a grinding process.

The second stack can be formed in which starting from an n$^-$ substrate, the n$^-$ substrate is connected to the second stack, i.e., to the n$^+$ layer by a wafer bonding process. In one embodiment, the n$^+$ layer is formed as the n$^+$ substrate.

In a further process step, the n$^-$ substrate is thinned to the desired thickness.

The thickness of the n$^-$ substrate can be within a range between 50 μm to 250 μm. The doping of the n$^-$ substrate can be within a range between $10^{13}$ N/cm$^{-3}$ and $10^{15}$ N/cm$^{-3}$. An advantage of the wafer bonding is that thick n$^-$ layers can be easily produced. This eliminates a long deposition process during epitaxy. The number of stacking faults can also be reduced by wafer bonding.

The n$^-$ substrate can have a doping greater than $10^{10}$ N/cm$^{-3}$ and less than $10^{13}$ N/cm$^{-3}$. Because the doping is extremely low, the n$^-$ substrate can also be construed to be an intrinsic layer.

The n$^-$ substrate can be connected directly to the first stack by a semiconductor bonding process step. The n$^-$ substrate is subsequently thinned to the desired thickness of the n$^-$ layer. After the thinning of the n$^-$ substrate or the n$^-$ layer, the n$^+$ layer with a doping in a range between $10^{18}$ N/cm$^{-3}$ and less than $5 \times 10^{18}$ N/cm$^{-3}$ is generated by epitaxy or a high-dose implantation.

The thinning of the n$^-$ substrate can occur by means of a CMP step, i.e., by chemical mechanical polishing.

The stacked semiconductor component can have a first connection contact layer, a second connection contact layer, and a p$^-$ layer, wherein the p$^-$ layer has a dopant concentration between $10^{12}$ and $10^{16}$ N/cm$^3$ and a layer thickness between 10 nm and 10 μm and comprises a GaAs compound or consists of a GaAs compound or comprises further III-V compounds or consists of further III-V compounds.

The n$^+$ region is formed layered with a layer thickness between 50 μm and 400 μm and the bottom side of the n$^-$ layer is integrally connected to the top side of the layered n$^+$ region.

The p$^-$ layer is integrally connected to the top side of the n$^-$ layer, and the p$^+$ region is formed of at least two subregions spaced from one another, wherein each subregion of the p$^+$ region has a dopant concentration of $5 \cdot 10^{18}$-$5 \cdot 10^{20}$ N/cm$^3$, is formed as ribs running parallel to a top side of the p$^-$ layer, and extends from the top side of the p$^-$ layer into the n$^-$ layer.

The ribs can be formed along certain crystallographic directions; i.e., the ribs can run along a given crystallographic direction.

The first connection contact layer can be integrally connected to the bottom side of the n$^+$ region.

The second connection contact layer can be connected integrally and electrically conductively to part of the top side of the p$^-$ layer, wherein the second connection contact layer is connected integrally and electrically conductively to the entire top side or to part of the top side of each subregion of the p$^+$ region.

The second connection contact layer comprises a metal or a metallic compound or consists of a metal or a metallic compound and forms a Schottky contact.

The second connection contact layer can be referred to as the anode and the first connection contact layer as the cathode. In this case, the first connection contact layer forms an ohmic contact and the second connection contact layer a metal-semiconductor junction. It is understood that still further layers can be formed on the connection contact layers in order to bond, for example, the Schottky diode.

An advantage is that the Schottky contact can be completely shielded from penetration of the high electrical field by means of the very thin, low-doped p layer as the third semiconductor layer and the p$^+$ regions which are formed at the edges and preferably below the second contact connection layer. For this purpose, the ribs are relatively close together, so that only relatively narrow n$^-$ layer regions remain between adjacent ribs.

As a result, blocking voltages of the Schottky diode in a range between 200 V and 600 V and also above 600 V can easily be reached. Fast switching times can be achieved in connection with the effective mass of GaAs which is substantially smaller in comparison with silicon. The Schottky diode of the invention is thus particularly suited as a freewheeling diode in the field of power electronics, preferably in the case of switching power supply units and inverters.

The second connection contact layer can be formed quadrangular, quadrangular with rounded edges, or circular and can cover more than 30%, most preferably more than 50% of the area of the semiconductor layer on the top side of the semiconductor stack.

A further semiconductor layer formed as an n$^-$ layer is disposed on the p$^-$ layer, wherein the further n$^-$ layer has a dopant concentration between $10^{12}$ N/cm$^3$ and $10^{16}$ N/cm$^3$ and a layer thickness between 0.005 μm and 10 μm and comprises a GaAs compound or consists of a GaAs compound. The further n$^-$ layer then forms a top side of the stack, wherein the p$^+$ regions extend from a top side of the further n$^-$ layer through the further n$^-$ layer and the p$^+$ layer into the underlying n$^-$ layer.

The III-V semiconductor component can have at least one p region, a dielectric layer being formed of one or more deposited layers (oxide, nitride), and at least three connection contact layers, wherein the p$^+$ region is formed as a layered substrate with a layer thickness of 50-500 μm; the p region is adjacent to the n$^-$ layer, has a dopant concentration of $10^{14}$-$10^{18}$ cm$^3$, and comprises a GaAs compound or consists of a GaAs compound; and the at least one p region forms a first pn junction with the n$^-$ layer, and the n$^+$ region forms a second pn junction with the at least one p region. The dielectric layer covers at least the first pn junction and the second pn junction and is integrally connected to the n$^-$ layer, the p region, and the n$^+$ region. A doped interlayer with a layer thickness of 1 μm-50 μm and a dopant concentration of $10^{12}$-$10^{17}$ cm$^3$ is disposed between the layered p$^+$ region and the n$^-$ layer, wherein the interlayer is integrally connected at least to the layered p$^+$ region. The first connection contact layer is connected electrically conductively to the bottom side of the layered p$^+$ region, the second connection contact layer is formed as field plate on the dielectric layer, and the third connection contact layer is connected electrically conductively to the at least one p region and the at least one n$^+$ region.

The second connection contact layer can be referred to as a gate. The first connection contact layer is typically referred to as a collector or anode, whereas the third connection contact layer is referred to as an emitter or cathode.

The interlayer of the IGBT semiconductor structure can have at least a different dopant concentration compared with the adjacent layers. The statements made above with respect to the interlayer in a semiconductor diode, in particular like the embodiments or the advantages, also apply accordingly to the interlayer in an IGBT semiconductor structure.

A total height of the IGBT semiconductor structure constitutes at most 150-500 μm and/or an edge length or a diameter of the IGBT semiconductor structure constitutes between 1 mm and 15 mm. For example, the p region and/or the n region can be formed circular or straight on the top side of the IGBT semiconductor structure, each with semicircles arranged on the front side of the structures.

The dielectric layer can comprise a deposited oxide and has a layer thickness of 10 nm to 1 μm.

An advantage is that the III-IV IGBT semiconductor structure can be produced more cost-effectively than comparable semiconductor structures made of SiC. Because of the higher minority charge carrier lifetime, the GaAs IGBT has a higher current-carrying capacity compared with comparable SIC components.

A further advantage of the III-V IGBT semiconductor structure of the invention is a high temperature resistance of up to 300° C. In other words, the III-V semiconductor diodes can also be used in hot environments.

According to a further embodiment, the $p^+$ region comprises zinc and/or the $n^+$ region chromium and/or silicon and/or palladium and/or tin and/or the $n^-$ layer silicon and/or palladium and/or tin.

Studies have shown that with certain combinations of a $p^-$ interlayer and an $n^-$ layer, different blocking voltages can be achieved in particular for semiconductor diodes.

In a first variant, for a blocking voltage of approximately 900 V, the $p^-$ interlayer comprises a thickness between 10 μm to 25 μm and the $n^-$ layer a thickness between 40 μm and 90 μm.

In a second variant, for a blocking voltage of approximately 1200 V, the $p^-$ interlayer comprises a thickness between 25 μm to 35 μm and the $n^-$ layer a thickness between 40 μm and 70 μm.

In a third variant, for a blocking voltage of approximately 1500 V, the $p^-$ interlayer comprises a thickness between 35 μm to 50 μm and the $n^-$ layer a thickness between 70 μm and 150 μm.

The diodes in the first to third variants can also be referred to as punch diodes.

In a fourth variant, the $p^-$ interlayer comprises a thickness between 10 μm to 25 μm and the $n^-$ layer a thickness between 60 μm and 110 μm.

In a fifth variant, the $p^-$ interlayer comprises a thickness between 25 μm to 35 μm and the $n^-$ layer a thickness between 70 μm and 140 μm.

In a sixth variant, the $p^-$ interlayer comprises a thickness between 35 μm to 50 μm and the $n^-$ layer a thickness between 80 μm and 200 μm.

The diodes in the fourth to sixth variants can also be referred to as "non-reach-through" diodes.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
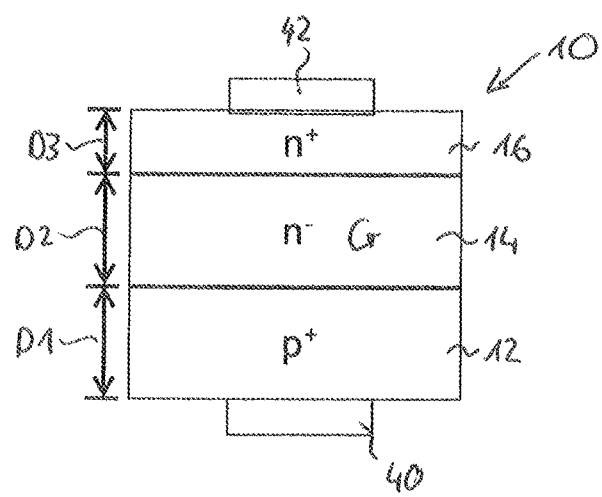
FIG. 1 shows a schematic view of an embodiment of the invention of a stacked III-V semiconductor component.
Figure 2:
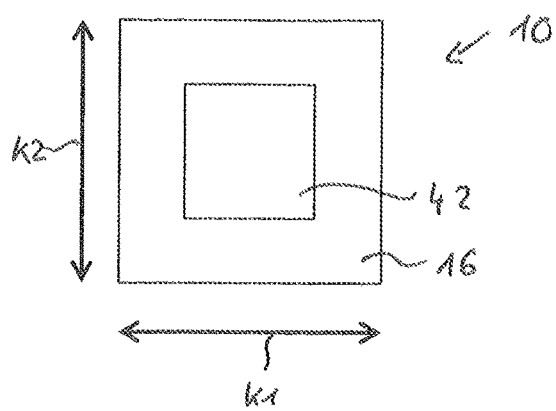
FIG. 2 shows a top plan view of the stacked III-V semiconductor element of FIG. 1.

The diagram in FIG. 1 shows a side view of an embodiment of a stacked III-V semiconductor component 10. The diagram in FIG. 2 shows a top plan view of III-V semiconductor component 10. Component 10 is formed as a diode with a stack of three semiconductor layers and two contact layers, wherein each semiconductor layer comprises a GaAs compound or consists of a GaAs compound.

The first semiconductor layer is $p^+$ region 12, formed as substrate, with a layer thickness D1 and is highly p-doped with a dopant concentration of $5 \cdot 10^{18}$-$5 \cdot 10^{20}$ N/cm$^3$. The second semiconductor layer is a first $n^-$ layer 14 with a layer thickness D2. The third semiconductor layer is a highly n-doped, layered $n^+$ region 16 with a dopant concentration of at least $10^{18}$ N/cm$^3$. The three semiconductor layers are grown monolithically on one another in the stated order, so that a bottom side of $p^-$ layer 14 is integrally connected to a top side of the $p^+$ substrate and a bottom side of the $n^+$ layer is integrally connected to $n^-$ layer 14.

The $n^-$ layer 14 is lightly n-doped with a dopant concentration between $10^{12}$ N/cm$^3$ and $10^{17}$ N/cm$^3$, wherein the dopant concentration increases by a factor of 1.5 to 2.5 in a direction from the bottom side of $n^-$ layer 14 to the top side of $n^-$ layer 14. In addition, $n^-$ layer 14 comprises chromium Cr with a concentration of at least $10^{14}$ N/cm$^3$ or at least $10^{15}$ N/cm$^3$.

A first contact layer 40 is integrally and electrically conductively connected to the bottom side of $p^+$ substrate 12, therefore the bottom side of the stack, and a second contact layer 42 is integrally and electrically conductively connected to the top side of the $n^+$ layer, therefore the top side of the stack, wherein the two contact layers 40 and 42 according to the illustrated exemplary embodiment only partially cover the respective surface of the semiconductor layer.

Alternatively, the $n^+$ layer is formed as a substrate, on which $n^-$ layer 14 and a layered $p^+$ region are created epitaxially, so that the bottom side of the $n^+$ layer forms the bottom side of the stack and the top side of the stack is the top side of the $p^+$ layer.

Figure 3:
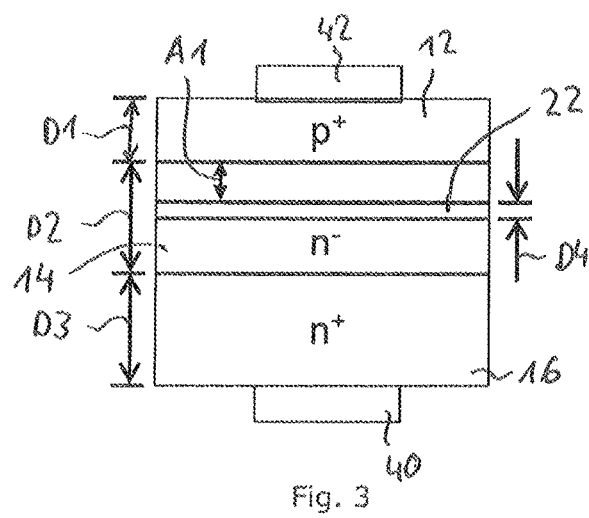
FIG. 3 shows a schematic view of an embodiment of the invention of a stacked III-V semiconductor diode.

In the diagram in FIG. 3, a further embodiment of a III-V semiconductor component of the invention is shown as a diode. Only the differences from the diagram in FIG. 1 will be explained below.

The $n^+$ region 14 is formed as a substrate on which $n^-$ layer 14 and a layered $p^+$ region are grown.

The $n^-$ layer 14 is lightly n-doped and has a dopant concentration that is constant over the entire layer. A defect layer 22 with a defect concentration in a range between $1 \cdot 10^{13}$ N/cm$^3$ and $5 \cdot 10^{16}$ N/cm$^3$ and with a layer thickness D4 0.5 µm and 50 µm is disposed within $n^-$ layer 14, wherein defect layer 22 has a first distance A1 to an interface between $n^-$ layer 14 and $p^+$ region 12, therefore to the top side of $n^-$ layer 14.

Figure 4:
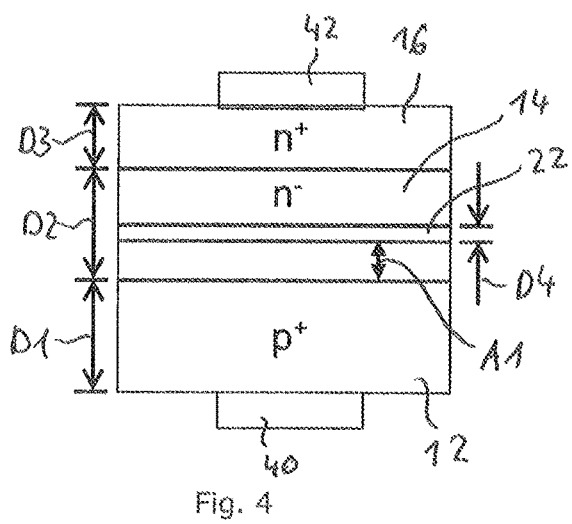
FIG. 4 shows a schematic view of an embodiment of the invention of a stacked III-V semiconductor diode.

An embodiment that is an alternative to the diagram in FIG. 3 is shown in the diagram in FIG. 4, wherein the order of the semiconductor layers is inverted, so that $p^+$ region 12 is formed as a layered substrate, followed by $n^-$ layer 14, containing defect layer 22, and $n^+$ layer 16. The first distance A1 accordingly provides the distance of defect layer 22 to the bottom side of $n^-$ layer 14.

Figure 5:
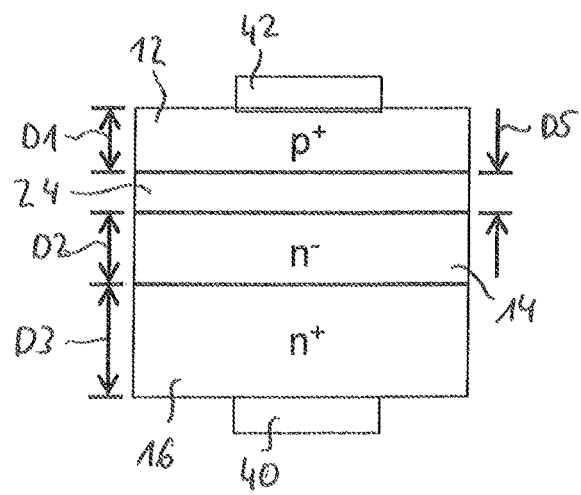
FIG. 5 shows a schematic view of an embodiment of the invention of a stacked III-V semiconductor diode.

A further embodiment of a III-V semiconductor component of the invention as a diode is shown in the diagram in FIG. 5. Only the differences from the diagram in FIG. 1 will be explained below.

The III-V semiconductor component 10 has $n^+$ region 16 as the substrate, followed by $n^-$ layer 14 with a dopant concentration that is constant over the entire layer, an interlayer 24 with a layer thickness D5, and $p^+$ layer 12. Interlayer 24 is p-doped or n-doped with a dopant concentration of $10^{12}$-$10^{17}$ cm$^3$.

Figure 6:
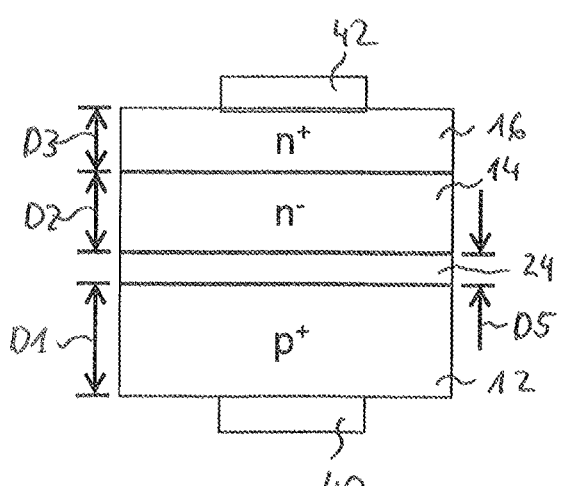
FIG. 6 shows a schematic view of an embodiment of the invention of a stacked III-V semiconductor diode.

An embodiment that is an alternative to the diagram in FIG. 5 is shown in the diagram in FIG. 6, wherein the order of the semiconductor layers is inverted, so that $p^+$ region 12 is formed as the substrate and is followed in the indicated order by interlayer 24, $n^-$ layer 14, and the $n^+$ layer.

Figure 7:
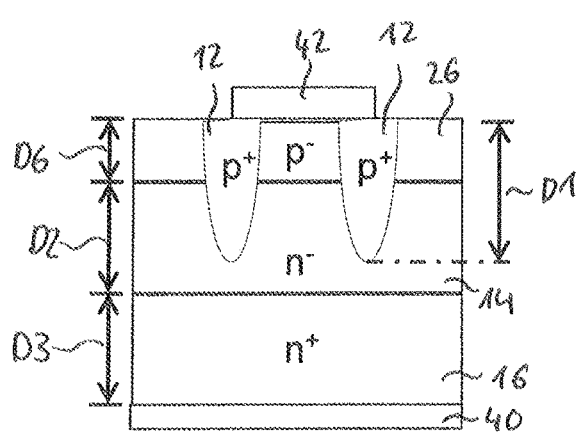
FIG. 7 shows a schematic view of an embodiment of the invention of a Schottky diode.

A further alternative embodiment of a III-V semiconductor component 10 of the invention is shown in the diagram in FIG. 7. Only the differences to the preceding figures will be described below.

III-V semiconductor component 10 is formed as a Schottky diode, having the $n^+$ region, formed as the substrate, and followed by layered $n^-$ region 14, grown monolithically on the substrate, and a $p^-$ layer 26, grown on $n^-$ region 14 and having a layer thickness D6. The $p^+$ region 12 has two subregions spaced from one another, wherein the subregions extend from a top side of $p^-$ layer 26 up to a depth D1 through the entire $p^-$ layer 26 into $n^-$ layer 14.

First connection contact layer 40 in the illustrated exemplary embodiment covers the entire bottom side of the $n^+$ substrate, whereas second connection contact layer 42 covers only part of the top side of $p^-$ layer 26 and in each case part of a top side of each $p^+$ subregion, so that in each case an edge of second connection contact layer 42 is located within the top side of a $p^+$ subregion.

Figure 8:
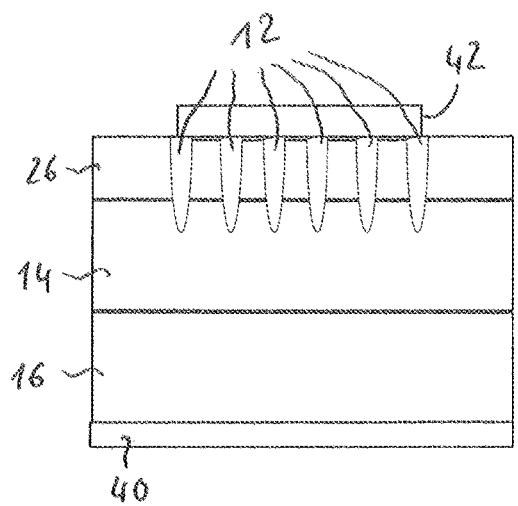
FIG. 8 shows a schematic view of an embodiment of the invention of a Schottky diode.

An embodiment of a Schottky diode of the invention that is an alternative to the diagram in FIG. 7 is shown in the diagram in FIG. 8, wherein the $p^+$ region is formed of six subregions, spaced from one another, and second contact layer 42 partially covers a top side of the first subregion and a top side of the sixth subregion and completely covers the top sides of the subregions lying therebetween.

Figure 9:
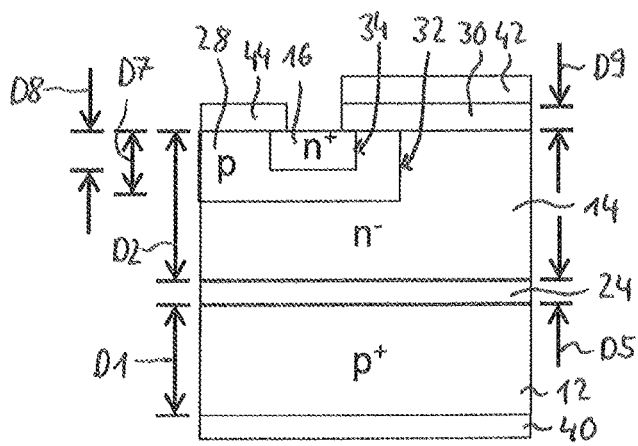
FIG. 9 shows a schematic view of an embodiment of the invention of an IGBT semiconductor structure.
Figure 10:
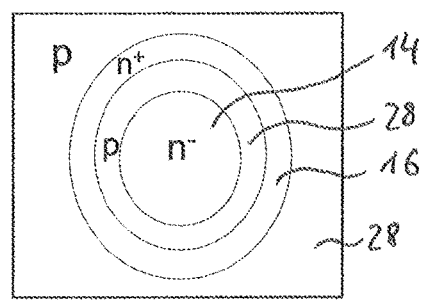
FIG. 10 shows a top plan view of the IGBT semiconductor structure of FIG. 9.

The diagrams of FIGS. 9 and 10 show a further alternative embodiment of a III-V semiconductor component 10 of the invention in a side view and a top view. Only the differences to the preceding figures will be described below.

III-V semiconductor component 10 is formed as a stacked IGBT semiconductor structure with a so-called non-punch-through design, wherein the $p^+$ region is formed as the substrate, followed by a lightly n-doped or p-doped interlayer 24 and an $n^-$ layer 14. The $n^-$ layer 14 forms part of a top side of the stack. Another part of the top side of the stack is formed by a p region 28, wherein p region 28 extends from the top side of the stack up to a depth D7 into $n^-$ layer 14. A further part of the top side of the stack is formed by $n^+$ region 16, wherein the $n^+$ region extends from the top side of the stack up to a depth D8 into p region 28 and the depth D7 of p region 28 is greater than depth D8 of $n^+$ region 16.

Thus, two pn junctions form, adjacent to the top side of the stack of the semiconductor structure, namely a first pn junction 32 between p region 28 and $p^-$ layer 14 and a second pn junction 34 between $n^+$ region 16 and p region 28. A dielectric layer 30 with a layer thickness D9 covers at least first pn junction 32 and second pn junction 34 and is integrally connected to the top side of the stack of the semiconductor structure, in particular to $n^+$ region 16, p region 28, and $n^-$ layer 14.

First connection contact layer 40 is formed as a metal layer, wherein the metal layer is integrally and electrically conductively connected to a bottom side of the stack, therefore to the bottom side of the $p^+$ region. Second connection contact 42 is formed as a field plate on a surface of dielectric layer 30, said surface facing away from the semiconductor structure. A third connection contact 44 is likewise formed as a metal layer, wherein the metal layer is integrally and electrically conductively connected to a part of the stack top side, said part being formed by p region 28 and $n^+$ region 16.

The top side of the semiconductor structure without contact layers as shown in the diagram of FIG. 10 has a rectangular contour, wherein p region 28 and $n^+$ region 16 are formed circular.

Figure 11:
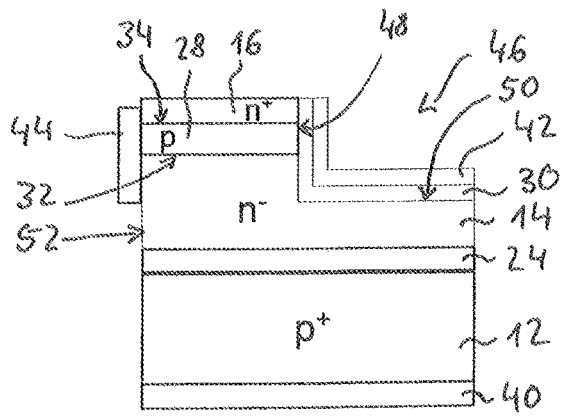
FIG. 11 shows a schematic view of a further embodiment of the invention of an IGBT semiconductor structure.

The diagram in FIG. 11 shows a further alternative embodiment of an IGBT semiconductor structure of the invention. Only the differences from the diagram in FIG. 9 will be explained below. Semiconductor structure 10 is formed as a so-called trench IGBT.

The p region 28 and $n^+$ region 16 are each formed as layers on $n^-$ layer 14 or p region 28, respectively, wherein the semiconductor structure has a trench 46 extending from the top side through layered $n^+$ region 16 and layered p region 28 into $n^-$ layer 14.

First pn junction 32 and second pn junction 34 run perpendicular to a side surface 48 of trench 46. Side surface 48 and a bottom 50 of trench 46 are covered by dielectric layer 30. Second connection contact 42, formed as a field plate, extends correspondingly on dielectric layer 30. Third connection contact layer 44 is located on a side surface 52 of the semiconductor structure, said surface lying opposite to side surface 48 of trench 46, and is connected electrically conductively to layered $n^+$ region 16 and to layered p region 28. Preferably, the side surfaces extend along crystallographic directions of the III-V semiconductor material.

The invention being thus described, it will be obvious that the same may be varied in many ways. Such variations are not to be regarded as a departure from the spirit and scope of the invention, and all such modifications as would be obvious to one skilled in the art are to be included within the scope of the following claims:

What is claimed is:

1. A stacked group III-V semiconductor component comprising:

a $p^+$ region with a top side, a bottom side, and an electrically active dopant concentration of $5\cdot10^{18}$-$5\cdot10^{20}$ N/cm$^3$;

a first $n^-$ layer with a top side and a bottom side, a dopant concentration of $10^{12}$-$10^{17}$ N/cm$^3$, cm, and a layer thickness of 10-300 µm;

an $n^+$ region with a top side, a bottom side, and a dopant concentration of at least $10^{18}$ N/cm$^3$;

wherein the $p^+$ regions, the $n^-$ layer, and the $n^+$ region follow one another and are each formed monolithically, and each comprise a GaAs compound or consist of a GaAs compound, wherein the $n^+$ region or the $p^+$ region is formed as a substrate layer, and wherein the $n^-$ layer comprises defects with a concentration of at least $10^{14}$ N/cm$^3$ or at least $10^{15}$ N/cm$^3$.

2. The stacked group III-V semiconductor component according to claim 1, wherein the $p^+$ region and the $n^+$ region are formed layered, wherein the layered $n^+$ region and the layered $p^+$ region are each integrally connected to the $n^-$ layer, wherein the layered $n^+$ region has a layer thickness of 50-675 µm, wherein the layered $p^+$ region has a layer thickness greater than 2 µm, wherein the stacked III-V semiconductor component has a defect layer with a layer thickness between 0.5 µm and 50 µm, and wherein the defect layer is disposed within the $n^-$ layer and has a defect concentration in a range between $1\cdot10^{13}$ N/cm$^3$ and $5\cdot10^{16}$ N/cm$^3$.

3. The stacked group III-V semiconductor component according to claim 2, wherein the defect layer has a layer thickness between 0.5 µm and 50 µm and a distance of the defect layer to an interface between the $n^-$ layer and the $p^+$ region is at most half the layer thickness of the $n^-$ layer.

4. The stacked group III-V semiconductor component according to claim 1, wherein the $p^+$ region and the $n^+$ region are formed layered, wherein the layered $n^+$ region is integrally connected to the $n^-$ layer, wherein a doped interlayer with a layer thickness of 1-50 µm and a dopant concentration of $10^{12}$-$10^{17}$ cm$^3$ is disposed between the $n^-$ layer and the $p^+$ layer, and wherein the interlayer is integrally connected to the $n^-$ layer and to the $p^+$ layer.

5. The stacked group III-V semiconductor component according to claim 1, wherein the $p^+$ region and the $n^+$ region are formed layered, wherein a p-doped interlayer with a layer thickness of 1-50 µm and a dopant concentration of $10^{12}$-$10^{17}$ cm$^3$ is disposed between the $n^-$ layer and the $p^+$ region, wherein the layered $n^+$ region and the interlayer are each integrally connected to the $n^-$ layer and the layered $p^+$ region is integrally connected to the interlayer, wherein the stacked III-V semiconductor component has a first defect layer with a layer thickness between 0.5 µm and 40 µm, and wherein the defect layer is disposed within the p-doped interlayer and has a defect concentration in a range between $1\cdot10^{13}$ N/cm$^3$ and $5\cdot10^{16}$ N/cm$^3$.

6. The stacked group III-V semiconductor component according to claim 1, wherein the $p^+$ region and the $n^+$ region are formed layered, wherein the layered $n^+$ region and the layered $p^+$ region are integrally connected to the $p^-$ layer, and wherein the dopant concentration within the $n^-$ layer of the surface, adjacent to the $p^+$ region, of the $n^-$ layer, to the surface, adjacent to the $n^+$ region, of the $n^-$ layer increases by a factor between 1.5 and 2.5.

7. The stacked group III-V semiconductor component according to claim 1, wherein the layered $p^+$ region is formed as the substrate with a layer thickness of 50-500 µm and the layered $n^+$ region has a layer thickness less than 30 µm.

8. The stacked group III-V semiconductor component according to claim 1, wherein the layered $n^+$ region is formed as a substrate with a layer thickness of 50-400 µm and the layered $p^+$ region has a layer thickness greater than 2 µm.

9. The stacked group III-V semiconductor component according to claim 1, wherein the stacked semiconductor component has a first connection contact layer, a second connection contact layer, and a $p^-$ layer, wherein the $p^-$ layer has a dopant concentration between $10^{12}$ and $10^{16}$ N/cm$^3$ and a layer thickness between 10 nm and 10 µm and comprises a GaAs compound or consists of GaAs compounds or comprises further III-V compounds or consists of further III-V compounds, wherein the $n^+$ region is formed layered with a layer thickness between 50 µm and 400 µm, wherein the bottom side of the $n^-$ layer is integrally connected to the top side of the layered $n^+$ region, wherein the $p^-$ layer is integrally connected to the top side of the $n^-$ layer, wherein the $p^+$ region is formed of at least two subregions spaced from to one another, wherein each subregion of the $p^+$ region has a dopant concentration of $5\cdot10^{18}$-$5\cdot10^{20}$ N/cm$^3$, is formed as ribs running parallel to a top side of the $p^-$ layer and extends from a top side of the $p^-$ layer into the $n^-$ layer, wherein the first connection contact layer is integrally connected to the bottom side of the $n^+$ region, wherein the second connection contact layer is integrally and electrically conductively connected to part of the top side of the $p^-$ layer, wherein the second connection contact layer is connected integrally and electrically conductively to the entire top side or to part of the top side of each subregion of the $p^+$ region, and wherein the second connection contact layer comprises a metal or a metallic compound or consists of a metal or a metallic compound and forms a Schottky contact.

10. The stacked group III-V semiconductor component according to claim 1, wherein the III-V semiconductor component has at least one p region, a dielectric layer, and at least three connection contact layers, wherein the $p^+$ region is formed as a layered substrate with a layer thickness of 50-500 µm, wherein the p region is adjacent to the $n^-$ layer, has a dopant concentration of $10^{14}$ N/cm$^3$-$10^{18}$ N/cm$^3$, and comprises a GaAs compound or consists of a GaAs compound, wherein the at least one p region forms a first pn junction with the $n^-$ layer, wherein the $n^+$ region forms a second pn junction with the at least one p region, wherein the dielectric layer covers at least the first pn junction and the second pn junction and is integrally connected to the $n^-$ layer, the p region, and the $n^+$ region, wherein a doped interlayer with a layer thickness from 1 µm to 50 µm and a dopant concentration of $10^{12}$-$10^{17}$ cm$^3$ is disposed between the layered $p^+$ region and the $n^-$ layer, wherein the interlayer is integrally connected at least to the layered $p^+$ region, wherein the first connection contact layer is connected electrically conductively to the bottom side of the layered $p^+$ region, wherein the second connection contact layer is formed as a field plate on the dielectric layer, and wherein the third connection contact layer is connected electrically conductively to the at least one p region and the at least one $n^+$ region.

11. The stacked group III-V semiconductor component according to claim 1, wherein the $p^+$ region comprises zinc.

12. The stacked group III-V semiconductor component according to claim 1, wherein the $n^+$ region comprises chromium and/or silicon and/or palladium and/or tin.

13. The stacked group III-V semiconductor component according to claim 1, wherein the $n^-$ layer comprises silicon and/or palladium and/or tin.

14. The stacked group III-V semiconductor component according to claim 1, wherein the $n^-$ layer comprises chromium with a concentration in a range between $1 \cdot 10^{13}$ N/cm$^3$ and $5 \cdot 10^{16}$ N/cm$^3$.

15. The stacked group III-V semiconductor component according to claim 1, wherein the semiconductor component is formed monolithically or comprises a semiconductor bond.

\* \* \* \* \*